US011811360B2

(12) United States Patent
Garg et al.

(10) Patent No.: US 11,811,360 B2
(45) Date of Patent: Nov. 7, 2023

(54) HIGH VOLTAGE SOLAR MODULES

(71) Applicant: Maxeon Solar Pte. Ltd., Singapore (SG)

(72) Inventors: Gopal Krishan Garg, Fremont, CA (US); Seung Bum Rim, Palo Alto, CA (US); Peter John Cousins, Los Altos, CA (US)

(73) Assignee: Maxeon Solar Pte. Ltd., Singapore (SG)

( * ) Notice: Subject to any disclaimer, the term of this patent is extended or adjusted under 35 U.S.C. 154(b) by 714 days.

(21) Appl. No.: 14/228,646

(22) Filed: Mar. 28, 2014

(65) Prior Publication Data
US 2015/0280641 A1 Oct. 1, 2015

(51) Int. Cl.
*H02S 40/32* (2014.01)
*H02S 40/34* (2014.01)
*H01L 31/05* (2014.01)
*H01L 31/0475* (2014.01)
*H01L 31/068* (2012.01)

(52) U.S. Cl.
CPC .......... *H02S 40/32* (2014.12); *H01L 31/0475* (2014.12); *H01L 31/0504* (2013.01); *H01L 31/068* (2013.01); *H02S 40/34* (2014.12); *Y02E 10/547* (2013.01)

(58) Field of Classification Search
CPC .......... H02J 3/383; H02S 40/32; H02S 40/34; H01L 31/02021; H01L 31/042; H01L 31/0504; H01L 31/0475; H01L 31/068; Y02E 10/547; Y02E 70/30; Y02E 10/56
See application file for complete search history.

(56) References Cited

U.S. PATENT DOCUMENTS

| | | | |
|---|---|---|---|
| 4,433,200 A * | 2/1984 | Jester | H01L 31/048 136/244 |
| 4,612,408 A | 9/1986 | Moddel et al. | |
| 4,652,693 A * | 3/1987 | Bar-On | H01L 31/0201 136/244 |
| 5,164,019 A | 11/1992 | Sinton | |
| 2004/0043528 A1 | 3/2004 | Kruhler | |

(Continued)

FOREIGN PATENT DOCUMENTS

| | | |
|---|---|---|
| CL | 2016002437 A1 | 2/2017 |
| CL | 2016002444 A1 | 2/2017 |

(Continued)

OTHER PUBLICATIONS

J. Lu, S. Stegen, and D. Butler, "High Frequency and High Power Density Transformers for DC/DC Converter used in Solar PV System" 2010 2nd IEEE International Symposium on Power Electronics for Distributed Generation Systems.*

(Continued)

*Primary Examiner* — Michael Y Sun
(74) *Attorney, Agent, or Firm* — Schwabe, Williamson & Wyatt, P.C.

(57) ABSTRACT

A photovoltaic module can include a high voltage photovoltaic laminate that include a plurality of high voltage photovoltaic cells with each of the high voltage photovoltaic cells including a plurality of sub-cells. A boost-less conversion device can be configured to convert a first voltage from the high voltage photovoltaic laminate to a second voltage.

21 Claims, 15 Drawing Sheets

(56) References Cited

U.S. PATENT DOCUMENTS

| | | | |
|---|---|---|---|
| 2005/0268959 A1* | 12/2005 | Aschenbrenner ... | H01L 31/0508 136/244 |
| 2006/0196535 A1* | 9/2006 | Swanson ............. | H02J 3/383 136/244 |
| 2010/0078056 A1* | 4/2010 | Hovel .................. | H01L 31/05 136/244 |
| 2010/0139746 A1* | 6/2010 | Von Maydell ...................... | H01L 31/022433 136/255 |
| 2010/0206378 A1* | 8/2010 | Erickson, Jr. ..... | H01L 31/02021 136/259 |
| 2010/0300514 A1* | 12/2010 | Denda ............. | H01L 31/022425 136/252 |
| 2011/0061705 A1* | 3/2011 | Croft .................. | H02S 40/32 136/244 |
| 2011/0100154 A1 | 5/2011 | Krause et al. | |
| 2012/0037203 A1* | 2/2012 | Sainoo ............ | B32B 17/10018 136/244 |
| 2012/0127764 A1* | 5/2012 | Phadke .............. | H02J 3/383 363/37 |
| 2012/0274264 A1 | 11/2012 | Mun et al. | |
| 2012/0322199 A1 | 12/2012 | Graff | |
| 2012/0325288 A1 | 12/2012 | Jang et al. | |
| 2013/0062958 A1 | 3/2013 | Erickson, Jr. et al. | |
| 2013/0146128 A1* | 6/2013 | Yang .................. | H01L 31/0516 136/251 |
| 2013/0200709 A1 | 8/2013 | Kirchner et al. | |
| 2013/0247965 A1 | 9/2013 | Swanson et al. | |
| 2013/0340804 A1* | 12/2013 | Moon ............... | H01L 31/0516 136/244 |
| 2014/0042815 A1 | 2/2014 | Maksimovic et al. | |
| 2014/0102508 A1* | 4/2014 | Ishii .................. | H01L 31/048 136/244 |
| 2014/0345668 A1* | 11/2014 | Jee .................... | H01L 31/0749 136/244 |
| 2015/0040961 A1* | 2/2015 | Ishii .................. | H01L 31/0516 136/244 |
| 2015/0059831 A1* | 3/2015 | Fukumochi .......... | H01L 31/048 136/246 |
| 2015/0136227 A1 | 5/2015 | Moslehi et al. | |
| 2015/0155398 A1 | 6/2015 | Moslehi et al. | |
| 2015/0187969 A1 | 7/2015 | Moslehi et al. | |
| 2015/0194547 A1 | 7/2015 | Moslehi et al. | |
| 2015/0200313 A1 | 7/2015 | Moslehi et al. | |
| 2016/0240705 A1 | 8/2016 | Takahama | |

FOREIGN PATENT DOCUMENTS

| | | | | |
|---|---|---|---|---|
| CL | 2016002438 A1 | | 6/2017 | |
| CN | 101714582 A | | 5/2010 | |
| CN | 103515360 A | | 1/2014 | |
| EP | 2273561 | | 1/2011 | |
| ER | 2518775 A2 | | 10/2012 | |
| JP | 2005301046 | | 10/2005 | |
| JP | 2009200445 A | | 9/2009 | |
| JP | 2010074161 A | | 4/2010 | |
| JP | WO 2013161810 A1 * | 10/2013 | ......... H01L 31/0516 |
| KR | 10-2013-0011689 | | 1/2013 | |
| KR | 101428146 B1 * | 8/2014 | ......... H01L 31/0749 |
| WO | WO-2013005475 A1 * | 1/2013 | ........... H01L 31/048 |
| WO | WO-2013168612 A1 * | 11/2013 | ........... H01L 31/048 |

OTHER PUBLICATIONS

Extended European Search Report for European Patent Application No. 15769496 dated Mar. 27, 2017, 9 pgs.
Brundlinger, R. , et al., "Module Integrated Power Converters—A Comparison of State-Of-The-Art Concepts and Performance Test Results", 26th European Photovoltaic Solar Energy Conference and Exhibition, Hamburg, Germany, Conference k Sep. 5-9, 2011, XP040637976, ISBN: 978-3-936338-27-0, 8 pgs.
International Search Report and Written Opinion for PCT Patent Application No. PCT/US2015/022337 dated Jun. 29, 2015, 7 pgs.
International Preliminary Report on Patentability for PCT Patent Application No. PCT/US2015/022337 dated Oct.6 , 2016, 9 pgs.
Carr, Anna J., et al., "A High Voltage MWT Module with Improved Shadow Performance", 978-1-4799-4398-2/14, IEEE, 2014, 4 pgs.
Henze, Norbert, et al., "A Novel AC Module With High-Voltage Panels in CIS Technology", 23rd European Photovoltaic Solar Energy Conference and Exhibition, Sep. 1-5, 2008, Valencia, Spain, Session 4DO.8.1, 10.4229/23rdEUPVSEC2008-4DO.8.1, 9 pgs.
Full Examination Report from Australian Patent Application No. 2015236209, dated Apr. 30, 2018, 3 pgs.
Second Office Action issued for Chilean Patent Application No. 02436-2016, dated Jun. 18, 2018; 9 pgs.
First Office Action from Chinese Patent Application No. 201580006029.3, dated Dec. 12, 2017.
First Office Action from Chilean Patent Application No. 02436-2016, dated Jan. 19, 2018, 6 pgs.
First Official Action for Appl. No. MX/a/2016/011536, dated Jun. 8, 2018; 8 pgs.(including English translation of the Official Action).
Second Office Action from Chinese Patent Application No. 201580006029.3, dated Aug. 10, 2018 (including partial translation of the office action).
Official Communication from European Patent Office for European Patent Application No. 15769496.9, dated Sep. 19, 2018; 5 pgs.
Third Office Action for Chinese Patent Application No. 2015800060293; dated Jan. 16, 2019; 16 pgs—including partial English translation of the Office Action.
Examination Report for Application No. 11201608039S; dated Feb. 22, 2019; 4 pgs.
Examination of European Patent Application No. 15769496.9 dated Oct. 14, 2020, 4 pgs.
Notification of Reasons for Refusal for Japanese Patent Application No. 2016-543166, dated Feb. 21, 2019, 5 pgs—with English translation.
Office Action from Korean Patent Application No. 10-2016-7029768 dated Sep. 8, 2021, 5 pgs.
Notice of Reasons for Refusal from Japanese Patent Application No. 2020-185414 dated Nov. 25, 2021, 10 pgs.
First Office Action from Chinese Patent Application No. 201910978388.5 dated Jul. 14, 2022, 17 pgs.
Final Notification of Reasons for Refusal from Japanese Patent Application No. 2016-543166 dated Jun. 10, 2020, 5 pgs.
Communication from European Patent Office for Application No. 15769496.9 dated Jan. 13, 2023, 6 pgs.

* cited by examiner

HIGH VOLTAGE SOLAR MODULES

BACKGROUND

Photovoltaic (PV) cells, commonly known as solar cells, are well known devices for conversion of solar radiation into electrical energy. Generally, solar radiation impinging on the surface of, and entering into, the substrate of a solar cell creates electron and hole pairs in the bulk of the substrate. The electron and hole pairs migrate to p-doped and n-doped regions in the substrate, thereby creating a voltage differential between the doped regions. The doped regions are connected to the conductive regions on the solar cell to direct an electrical current from the cell to an external circuit. When PV cells are combined in an array such as a PV module, the electrical energy collected from all of the PV cells can provide power with a certain voltage and current.

DETAILED DESCRIPTION

Figure 1:
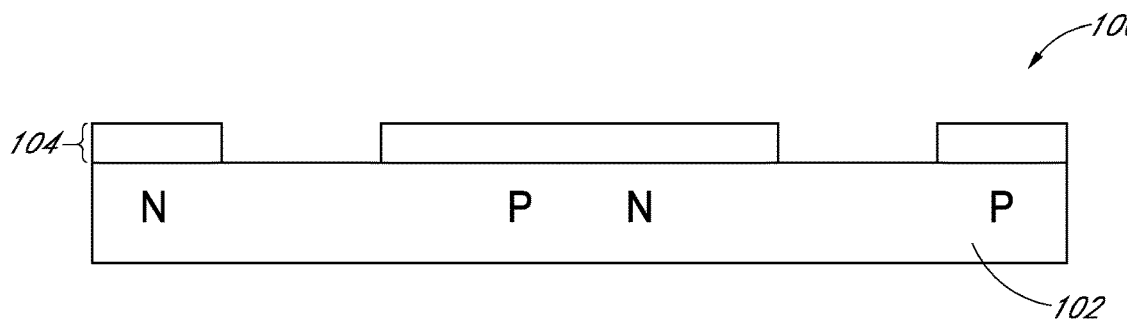
FIG. 1 illustrates a cross-sectional view of a solar cell prior to singulation to form physically separated sub-cells, in accordance with some embodiments.

The following detailed description is merely illustrative in nature and is not intended to limit the embodiments of the subject matter of the application or uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, brief summary or the following detailed description.

This specification includes references to "one embodiment" or "an embodiment." The appearances of the phrases "in one embodiment" or "in an embodiment" do not necessarily refer to the same embodiment. Particular features, structures, or characteristics may be combined in any suitable manner consistent with this disclosure.

Terminology. The following paragraphs provide definitions and/or context for terms found in this disclosure (including the appended claims):

"Comprising." This term is open-ended. As used in the appended claims, this term does not foreclose additional structure or steps.

"Configured To." Various units or components may be described or claimed as "configured to" perform a task or tasks. In such contexts, "configured to" is used to connote structure by indicating that the units/components include structure that performs those task or tasks during operation. As such, the unit/component can be said to be configured to perform the task even when the specified unit/component is not currently operational (e.g., is not on/active). Reciting that a unit/circuit/component is "configured to" perform one or more tasks is expressly intended not to invoke 35 U.S.C. §112, sixth paragraph, for that unit/component.

"First," "Second," etc. As used herein, these terms are used as labels for nouns that they precede, and do not imply any type of ordering (e.g., spatial, temporal, logical, etc.). For example, reference to a "first" photovoltaic module does not necessarily imply that this photovoltaic module is the first photovoltaic module in a sequence; instead the term "first" is used to differentiate this photovoltaic module from another photovoltaic module (e.g., a "second" photovoltaic module).

"Based On." As used herein, this term is used to describe one or more factors that affect a determination. This term does not foreclose additional factors that may affect a determination. That is, a determination may be solely based on those factors or based, at least in part, on those factors. Consider the phrase "determine A based on B." While B may be a factor that affects the determination of A, such a phrase does not foreclose the determination of A from also being based on C. In other instances, A may be determined based solely on B.

"Coupled"—The following description refers to elements or nodes or features being "coupled" together. As used herein, unless expressly stated otherwise, "coupled" means that one element/node/feature is directly or indirectly joined to (or directly or indirectly communicates with) another element/node/feature, and not necessarily mechanically.

In addition, certain terminology may also be used in the following description for the purpose of reference only, and thus are not intended to be limiting. For example, terms such as "upper", "lower", "above", and "below" refer to directions in the drawings to which reference is made. Terms such as "front", "back", "rear", "side", "outboard", and "inboard" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

High voltage solar cells (also referred to herein as photovoltaic cells), solar modules (also referred to herein as photovoltaic modules), and their applications are disclosed. In the following description, numerous specific details are set forth, such as specific operations, in order to provide a thorough understanding of embodiments of the present disclosure. It will be apparent to one skilled in the art that embodiments of the present disclosure may be practiced without these specific details. In other instances, well-known techniques are not described in detail in order to not unnecessarily obscure embodiments of the present disclosure.

The specification first describes example structures and techniques creating a high voltage wafer (e.g., solar cell) and PV module, followed by a description of various example high voltage modules with boost-less voltage conversion devices. Various examples are provided throughout the specification.

In some embodiments, solar cells can be diced into smaller individual diodes, e.g., 2, 4, 16, etc., such that the current is reduced both by smaller area, as well as by shorter current transport lengths along the contact fingers.

In one embodiment, each sub-cell can be diced, then interconnected together whereas in other embodiments, high voltage wafers and solar cells can be created by using metallization as a handle to enable dicing or singulation of solar cell wafers without increasing module interconnections or requiring handling of smaller cells. In an exemplary embodiment, a single solar cell (e.g., 125 cm, 156 cm, 210 cm) is subdivided into smaller cells to allow for flexibility in module current and voltage, as well as flexibility in the metallization.

Figure 9:
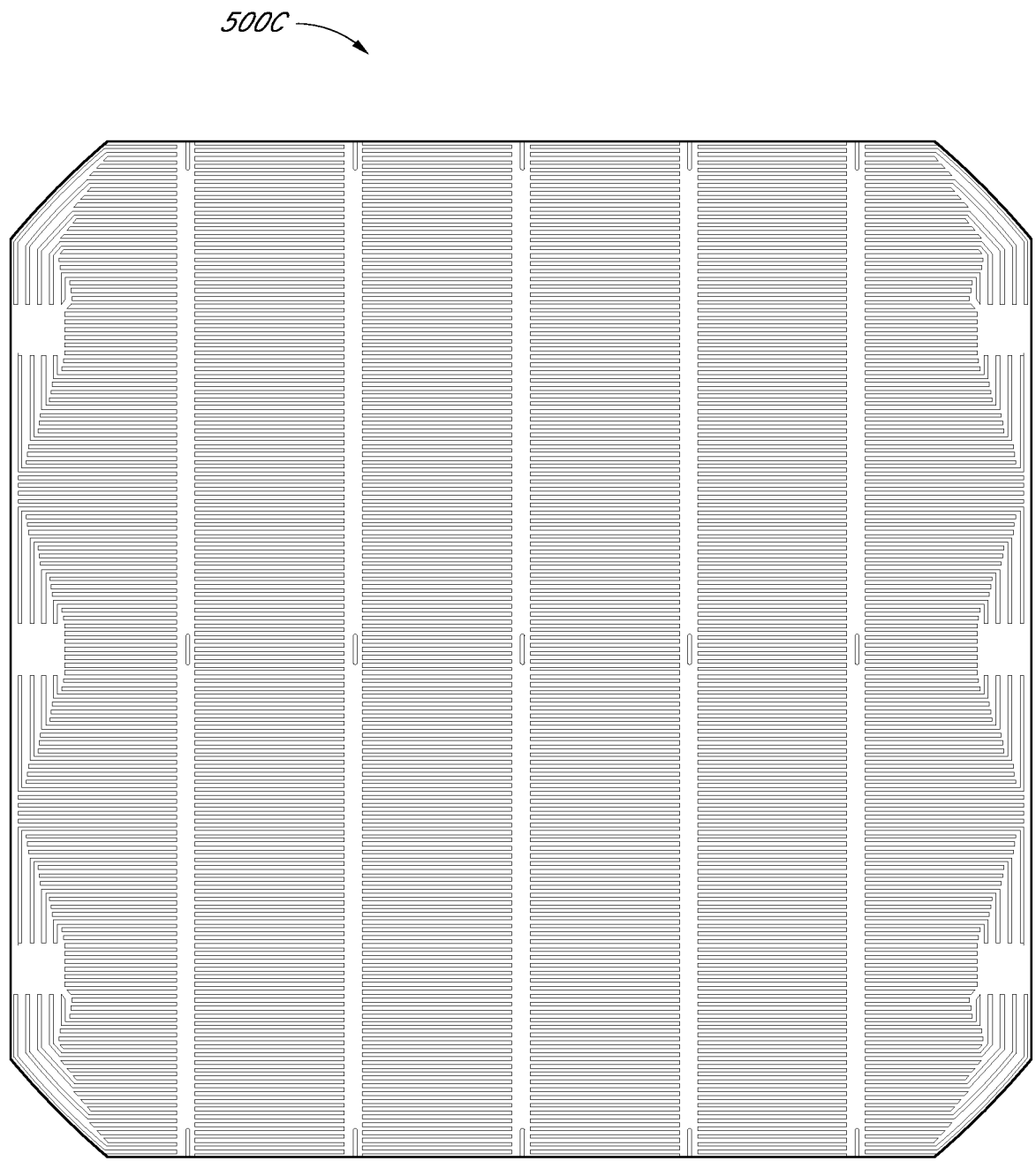

As an example to demonstrate module current and voltage flexibilty, consider the scenario in which a single silicon P/N diode has an open circuit voltage (Voc) of 0.6 to 0.74 V. The maximum power voltage (Vmp) for some solar cells is roughly 0.63V. Thus, single diode cells will have a voltage of 0.63V. In such an example, if 10 sub-diodes are produced on a single full-area wafer, and connected in series (as illustrated in the example of FIG. 9), the voltage would be 6.3V for the entire cell (at roughly $\frac{1}{10}^{th}$ the current, or about 0.5 A for a standard cell). If 96 cells of this voltage were to be arranged in series in a module, the module operating voltage would be ~604.8V DC, thereby creating a high voltage module, as opposed to a standard module Vmp of 30-65V DC. A high voltage module is used herein to mean a module that has a Vmp approximately half an order of magnitude greater the Vmp of a standard module of the same size as the high voltage module. As disclosed herein, one application for a high voltage module with this voltage range is the ability to simplify, reduce, or even eliminate the need for power electronics inside inverters or power optimizers.

In some embodiments, a metallization scheme is used to hold and provide mechanical integrity for the sub-cells together within the parent cell, such that additional handling complexity is not necessarily required when building the module, and the cells remain physically separated. Some embodiments further involve the use of built-in strain-relief within the sub-cell interconnects. Embodiments described may enable scalability to larger wafers without handling complexity or metallization issues in manufacturing, or increased field reliability concerns.

In various embodiments, a monolithic metallization structure can be used as a backplane to tie the sub-cells together before singulation. In such embodiments, a separate backplane distinct from the back side of the metallization structure is not required. This approach enables an inter-cell connection on a corresponding parent cell that does not require individual sub-cell handling or additional levels of metal interconnects. Furthermore, it allows for built-in metallization of the interconnects and therefore removes or significantly reduces dead space from traditional interconnection pads. In accordance with embodiments described herein, several exemplary layouts using half-cell, quarter-cell, 10 or 6-cell designs are described in greater detail below. Note that in some arrangements, other designs are contemplated, such as designs that include a 3×3, 4×4, or some other sub-cell configuration with a parent cell. Some embodiments are directed to back contact solar cells, and some embodiments enable the fabrication of diced multi-diode cells with controllable voltage and current, modules with variable voltage and current, and the fabrication of relatively large cells.

In various embodiments, a design that builds in strain relief for the inter-cell interconnects is implemented along with the singulation approaches described above to reduce the risk of cracking. Moreover, in some embodiments, approaches for reducing the edge losses are implemented. In one such embodiment, pre-grooving is performed prior to texturizing a light-receiving surface of the solar cell. This is followed by a break process and, possibly, a post-isolation passivation process.

In various embodiments, approaches are described for addressing the risk of damage of the metal during a substrate or wafer (e.g., silicon) isolation process. In an exemplary embodiment, damage is eliminated or at least mitigated by using a buffer material as an ablation stop, such that the metal is not directly scribed.

Additional risks can include shunting through the base, e.g., by not totally isolating the Si, or having the isolated Si regions touch each other during cycling. One or more embodiments address such issues by introducing an encapsulant to fill a groove between individual silicon portions to mitigate the risk of shunting and wear of the silicon. In one such embodiment, a metal-tolerant passivation material is used as a primary or secondary anti-reflective coating (ARC) layer to passivate and insulate the edge.

As described in greater detail below in association with the Figures, specific embodiments described herein can be implemented based on the understanding that metal or metallization structures having a thickness of greater than approximately 20 microns can be used to prevent power loss otherwise associated with silicon (Si)-cracking in a solar cell by using the metal to hold the cell together. Embodiments described herein provide a metal structure (e.g., by plating, or foil, or ribbon, etc.) that is bonded to a full-area wafer having sub-cells. The metal is patterned such that the sub-cell interconnects are formed in the same operation as the sub-cell metallization. Furthermore, the sub-cells are arranged within the full cell such that the Si can be isolated to provide an integer number of sub-diodes, connected through the resulting metallization structure. Following connection using a metallization structure of sufficient thickness, the diodes may be isolated. In one such embodiment, the metal can be patterned during plating or formation to include a strain relief feature between the cells, such as with a rounded groove. Subsequent to isolation, the edges can be passivated and/or insulated, both to limit power loss from recombination at the edge, and also to provide insulation against shunting.

Figure 2:
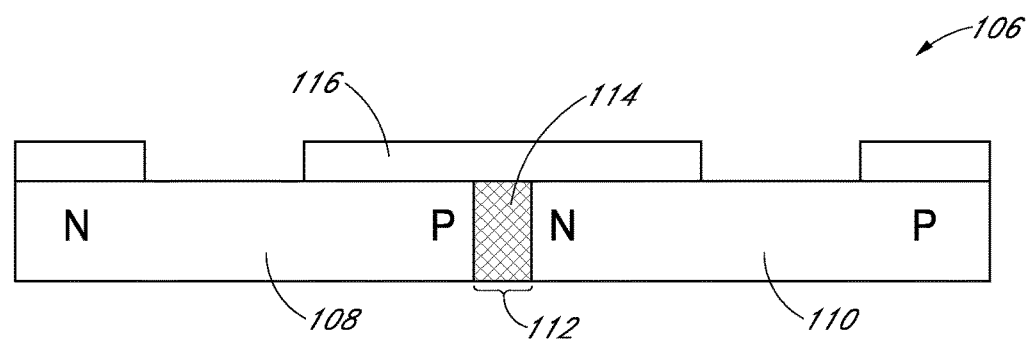
FIG. 2 illustrates a cross-sectional view of a solar cell subsequent to singulation to form physically separated sub-cells, in accordance with some embodiments.

As an exemplary representation of some of the concepts involved herein, FIGS. 1 and 2 illustrate cross-sectional views of a solar cell before and after, respectively, singulation to form physically separated sub-cells, in accordance with an embodiment of the present disclosure.

Referring to FIG. 1, a solar cell 100 includes a substrate 102 having a metallization structure 104 disposed thereon. The solar cell 100 includes alternating N-type and P-type regions in or above the substrate 102. In one embodiment, the metallization structure 104 is a monolithic metallization structure, as is described in greater detail below. Referring to FIG. 2, the solar cell 100 has been singulated or diced to provide a solar cell 106 having sub-cells 108 and 110 which are physically separated from one another. In one embodiment, the solar cell 100 is singulated using laser ablation, which is described in greater detail below. In an embodiment, a resulting groove 112 formed upon singulation is filled with an encapsulant material 114, as is depicted in FIG. 2. In an embodiment, as is also depicted in FIG. 2, a portion 116 of the metallization structure 104 bridges the two sub-cells 108 and 110. In a particular embodiment, the sub-cells 108 and 110 provide series or parallel diode structures, examples of which are described in detail below.

Figure 3:
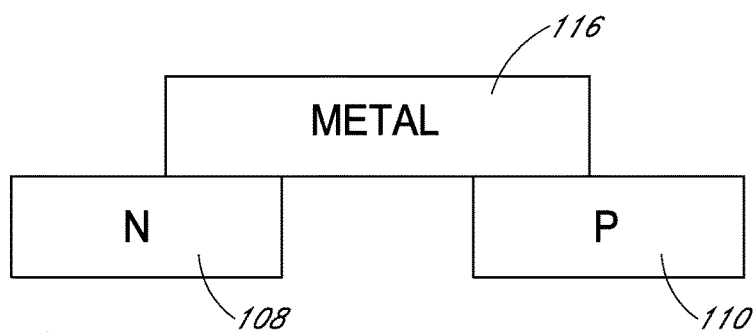
FIG. 3 illustrates a cross-sections view of a portion of a pair of singulated sub-cells using metal as a back-stop for cell singulation, in accordance with some embodiments.

Referring again to FIGS. 1 and 2, the portion 116 of the metallization structure 104 is used as both a mechanical support and a back-stop during dicing, e.g., during laser ablation of the substrate 102 material. In a first particular example, FIG. 3 illustrates a cross-sections view of a portion of a pair of singulated sub-cells using metal as a back-stop for cell singulation, in accordance with an embodiment of the present disclosure. Referring to FIG. 3, the sub-cells 108 and 110 are formed upon singulation of the substrate 102, having the groove 112 there between. The portion 116 of the metallization structure 104 is formed directly on the back surface of substrate 102 and, as such, a metal or metallic region is used as a back-stop during singulation.

Figure 4:
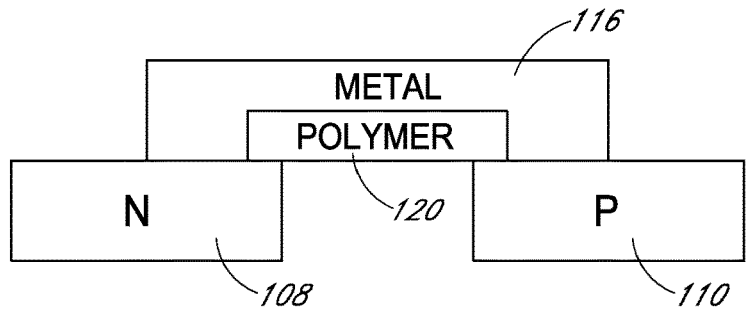
FIG. 4 illustrates a cross-sections view of a portion of a pair of singulated sub-cells using a buffer material as a back-stop for cell singulation, in accordance with some embodiments.

In a second particular example, FIG. 4 illustrates a cross-sectional view of a portion of a pair of singulated sub-cells using a buffer material (e.g., polymer) as a back-stop for cell singulation, in accordance with an embodiment of the present disclosure. Referring to FIG. 4, the sub-cells 108 and 110 are formed upon singulation of the substrate 102, having the groove 112 there between. However, the portion 116 of the metallization structure 104 is formed on a polymer region 120, which in turn is formed directly on the back surface of substrate 102 and, as such, the buffer material is used as a back-stop during singulation. In either of the cases of FIGS. 3 and 4, it is to be appreciated that, in an embodiment, the metallization structure 104 can be viewed as a monolithic metallization structure, as described in greater detail below. Furthermore, in an embodiment, in either case, a sub-cell interconnect is fabricated in a same operation as the sub-cell metal. Alternatively, a sub-cell interconnect may be externally applied, but additional processing operations would be needed.

Referring again to FIGS. 1-3, more generally, in an embodiment, a solar cell includes a plurality of sub-cells. Each of the sub-cells has a singulated and physically separated semiconductor substrate portion. Adjacent ones of the singulated and physically separated semiconductor substrate portions have a groove there between. The solar cell also includes a metallization structure. A portion of the metallization structure couples ones of the plurality of sub-cells. Furthermore, the groove between adjacent ones of the singulated and physically separated semiconductor substrate portions exposes a portion of the metallization structure.

In an embodiment, the metallization structure is fabricated from a foil (e.g., a conductive foil, such as an aluminum foil with or without an additional seed layer) or is fabricated by a plating process. In one such embodiment, in the case that a relatively thick (e.g., >25 um) back metal is used, some tolerance for partial laser ablation into the metal may be accommodated. However, if a thin metallization structure (e.g., <25 um) is used, ablation may need to be halted without any scribing of the metallization structure, so as to maintain the electrical and physical integrity of the metal required to survive reliability testing. The metallization structure may be fabricated by plating, printing, by use of a bonding procedure (e.g., in the case of a foil), or may be fabricated by a by a deposition, lithographic, and etch approach.

In an embodiment, in the case that a buffer stop is implemented (as described in association with FIG. 4), the buffer stop is a polymer such as polyimide. The polymer may be globally deposited and then patterned or may be deposited only in desired, e.g., by printing. In other embodiments, such a buffer stop is composed of a dielectric material such as, but not limited to, silicon dioxide ($SiO_2$), silicon nitride (SiN) or silicon oxynitride (SiON). In one such embodiment, the dielectric material is formed using a deposition technique such as, but not limited to, low pressure chemical vapor deposition (LPCVD), plasma enhanced chemical vapor deposition (PECVD), high density plasma chemical vapor deposition (HDPCVD) or physical vapor deposition (PVD).

It is to be appreciated that one or more embodiments described herein involve implementation of metallization that is single-level 'monolithic' across all sub-cells. Thus, the resulting cell metallization can be identical to the interconnect metallization and fabricated in the same process, at the same time. In one such embodiment, use of a monolithic metallization structure leads to implementation of cell isolation as completed subsequent all diodes being metallized. In other embodiments, however, a multi-step process can be used. In more particular embodiments, a monolithic metallization approach is implemented in conjunction with a buffer or protective layer (e.g., as described in FIG. 4) over which the monolithic metallization structure is formed. Such embodiments can allow for ablation stop on the buffer or protective layer without exposing the metal itself, as is described in greater detail below.

As described in association with FIG. 2, a diced solar cell further includes an encapsulating material (e.g., EVA, polyolefin, etc.) disposed in the groove between adjacent ones of the singulated and physically separated semiconductor substrate portions. In one such embodiment, the encapsulant provides shunt resistance as well as wear resistance between adjacent sub-cell portions. In one embodiment, the encapsulant material has a dielectric breakdown strength greater than approximately 1000V/cm, such that the material adequately provides shunt protection between adjacent sub-cells. In one embodiment, as applied, the encapsulant has sufficiently low viscosity or high melt-flow to ensure that the encapsulant material flows into the thin groove resulting from singulation. In one embodiment, filling of the groove by the encapsulant acts to improve the mechanical strength of the system through formation of Si/metal/polymer composite.

In accordance with an embodiment of the present disclosure, each sub-cell of a diced solar cell has approximately a same voltage characteristic and approximately a same current characteristic. In an embodiment, the plurality of sub-cells is a plurality of in-parallel diodes, in-series diodes, or a combination thereof. In an embodiment, the solar cell and, hence, the sub-cell portions, is a back-contact solar cell, and the metallization structure is disposed on the back surface, opposite a light-receiving surface, of each of the singulated and physically separated semiconductor substrate portions. In one such embodiment, the back surface of each of the sub-cells has approximately a same surface area. In a particular embodiment, the light-receiving surface of each of the sub-cells is a texturized surface, as is described in greater detail below. In other embodiments, the solar cell is a front contact solar cell.

In accordance with an embodiment of the present disclosure, each of the singulated and physically separated semiconductor substrate portions is a bulk monocrystalline silicon substrate portion, such as fabricated from an N-type monocrystalline substrate. In one such embodiment, each silicon portion includes one or more N+ regions (e.g., phosphorous or arsenic doped regions) and one or more P+ regions (e.g. boron doped regions) formed in substrate itself. In other embodiments, each silicon portion includes one or more polycrystalline silicon N+ regions and one or more polycrystalline silicon P+ regions formed above a silicon substrate.

It is to be appreciated that a variety of arrangements of numbers and electrically coupling of sub-cells within a singulated solar cell may be contemplated within the spirit and scope of embodiments described herein. And although the examples of FIGS. 5-9 illustrate various example (e.g., 2×2 or 2×1) sub-cell arrangements, in some embodiments, other arrangements (e.g., 3×3, 4×4, etc.) can be used. Additionally, although the examples of FIGS. 5-9 illustrate series or parallel arrangements, in some embodiments, a combination series and parallel arrangement can be implemented.

Figure 5:
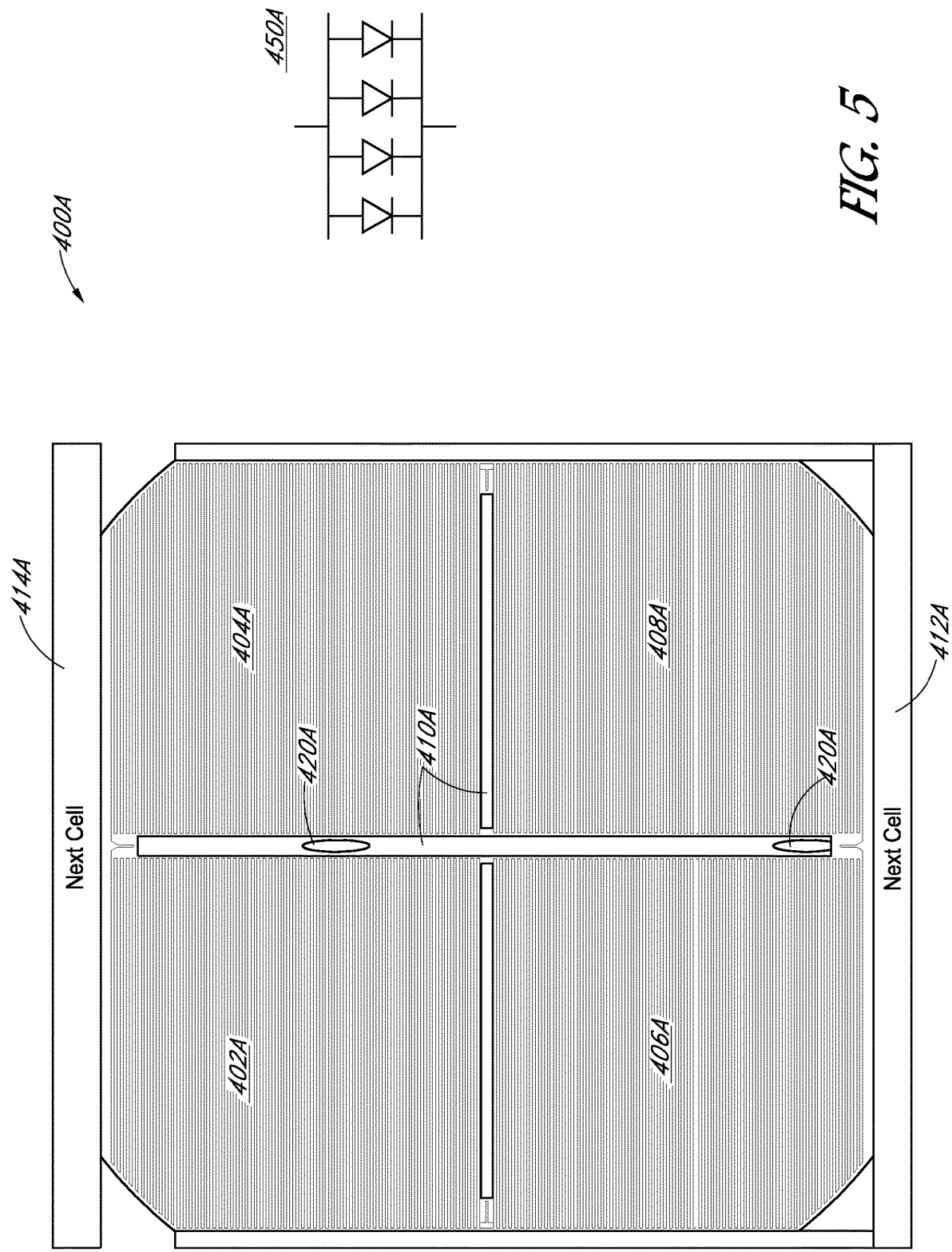
FIGS. 5-9 illustrate plan views of various example solar cells, from the metallization side of the respective solar cell, which have been diced into sub-cells, in accordance with some embodiments.

In a first example, FIG. 5 illustrates a plan view from the metallization side of a solar cell 400A that has been diced into four sub-cells, in accordance with an embodiment of the present disclosure. Referring to FIG. 5, the solar cell 400A is singulated to provide four sub-cells 402A, 404A, 406A and 408A. Metallization lines 410A are used to hold the quad-cell design together where each of the sub-cells meet. In one embodiment, stress-relief features 420A are included in the metallization lines 410A, as depicted in FIG. 5. Additionally, metallization coupling to a first next cell location 412A and a second next cell location 414A is depicted.

Referring again to FIG. 5, a diode schematic 450A illustrates the electrical configuration of the parallel quad-cell design. In an embodiment, the individual sub-cells are ¼ current of a full-sized single diode cell, and have the same voltage as the single diode cell, whereas the combined 4-diode full cell has the same current and same voltage as the full-sized single diode cell. The scribe cut can be performed on diffusion regions with lowest recombination post isolation. The metal line length is ½ standard cell with ¼ cell bridging, which can enable either a reduction of metal thickness for the same size cell, or allow scaling to larger wafers without needing to increase the metal thickness.

Figure 6:
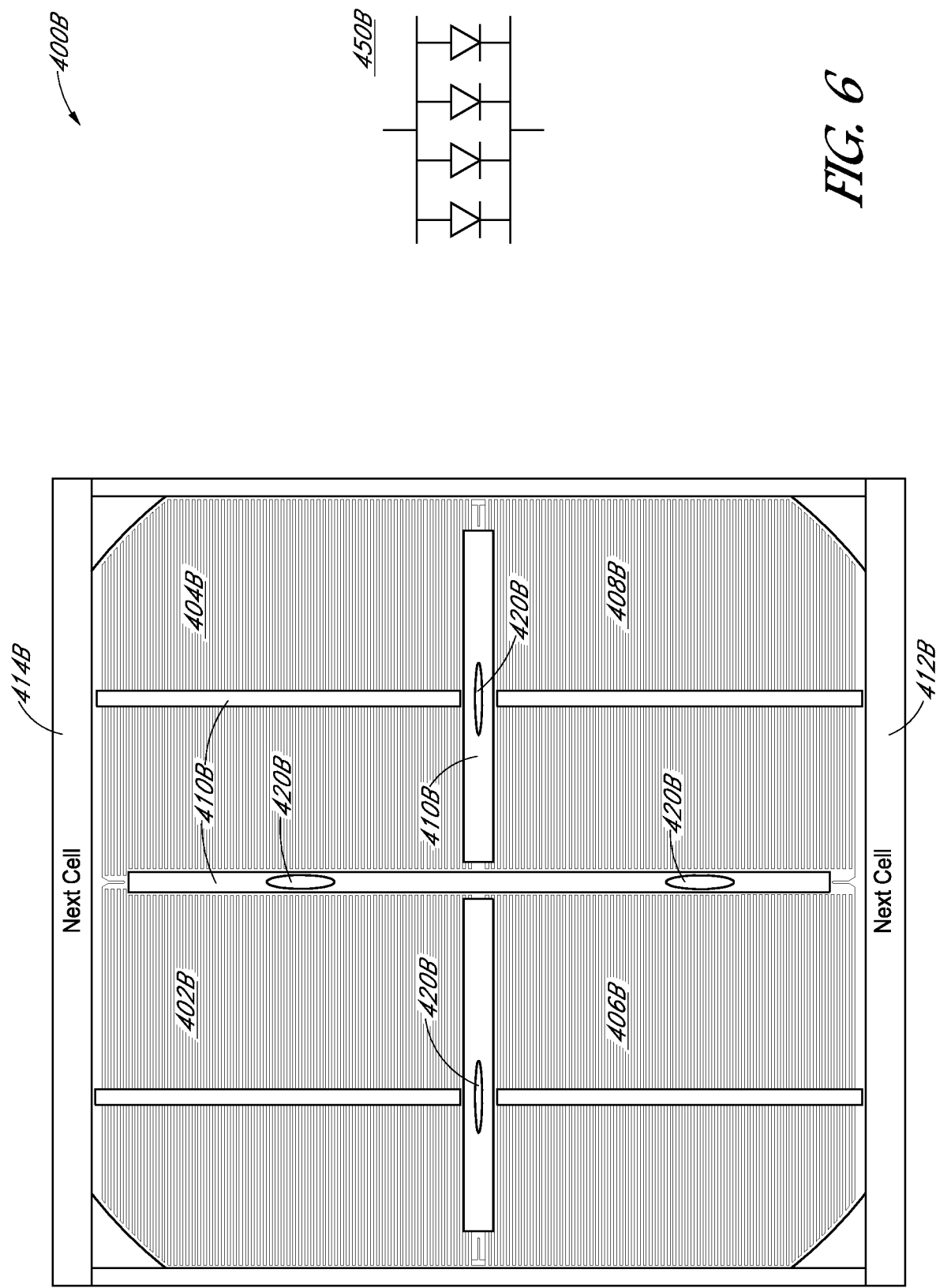

In a second example, FIG. 6 illustrates a plan view from the metallization side of another solar cell 400B that has been diced into four sub-cells, in accordance with another embodiment of the present disclosure. Referring to FIG. 6, the solar cell 400B is singulated to provide four sub-cells 402B, 404B, 406B and 408B. Metallization lines 410B are used to hold the quad-cell design together where each of the sub-cells meet. In one embodiment, stress-relief features 420B are included in the metallization lines 410B, as depicted in FIG. 6. Additionally, metallization coupling to a first next cell location 412B and a second next cell location 414B is depicted.

Referring again to FIG. 6, a diode schematic 450B illustrates the electrical configuration of the parallel quad-cell design. In an embodiment, the individual sub-cells are ¼ current of a full-sized single diode cell, and have the same voltage as the single diode cell, whereas the combined 4-diode full cell has the same current and same voltage as the full-sized single diode cell. The scribe cut can be performed on diffusion regions with lowest recombination post isolation. The metal line length is ¼ standard cell, which can enable either a reduction of metal thickness for the same size cell, or allow scaling to larger wafers without needing to increase the metal thickness.

Figure 7:
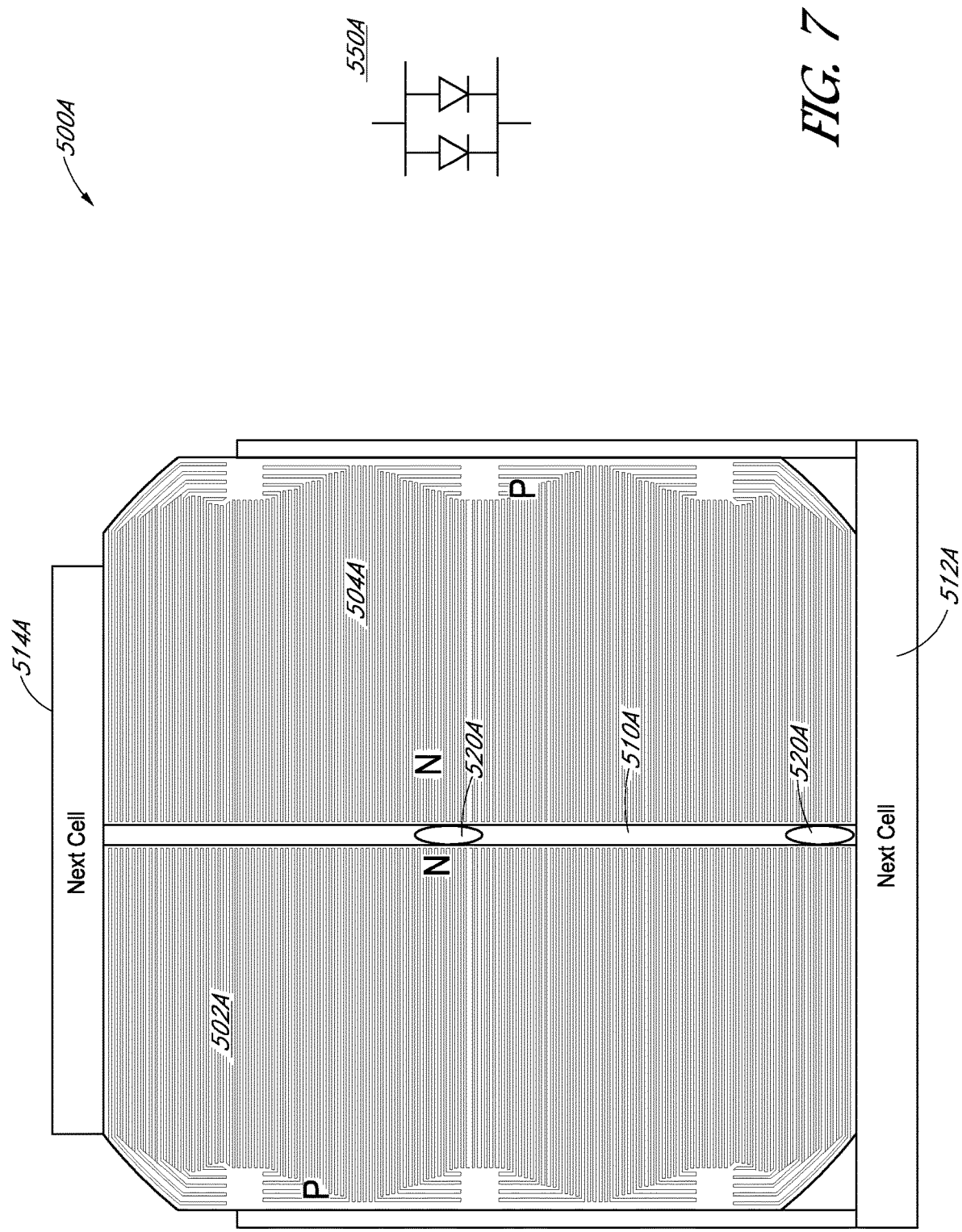

In a third example, FIG. 7 illustrates a plan view from the metallization side of an solar cell 500A that has been diced into two sub-cells in a parallel arrangement, in accordance with an embodiment of the present disclosure. Referring to FIG. 7, the solar cell 500A is singulated to provide two sub-cells 502A and 504A. A metallization line 510A is used to hold the dual-cell design together where each of the sub-cells meet. In one embodiment, stress-relief features 520A are included in the metallization line 510A, as depicted in FIG. 7. Additionally, metallization coupling to a first next cell location 512A and a second next cell location 514A is depicted.

Referring again to FIG. 7, a diode schematic 550A illustrates the electrical configuration of the parallel dual-cell design. In an embodiment, the individual sub-cells are ½ current of a single diode full cell and have the same voltage as the single diode cell, whereas the combined 2-diode full cell has the same current, same voltage as the full-size single diode cell. The scribe cut can be performed on diffusion regions with lowest recombination post isolation. The metal line length is ½ standard cell to provide a single metal joint holding two half cells together.

Figure 8:
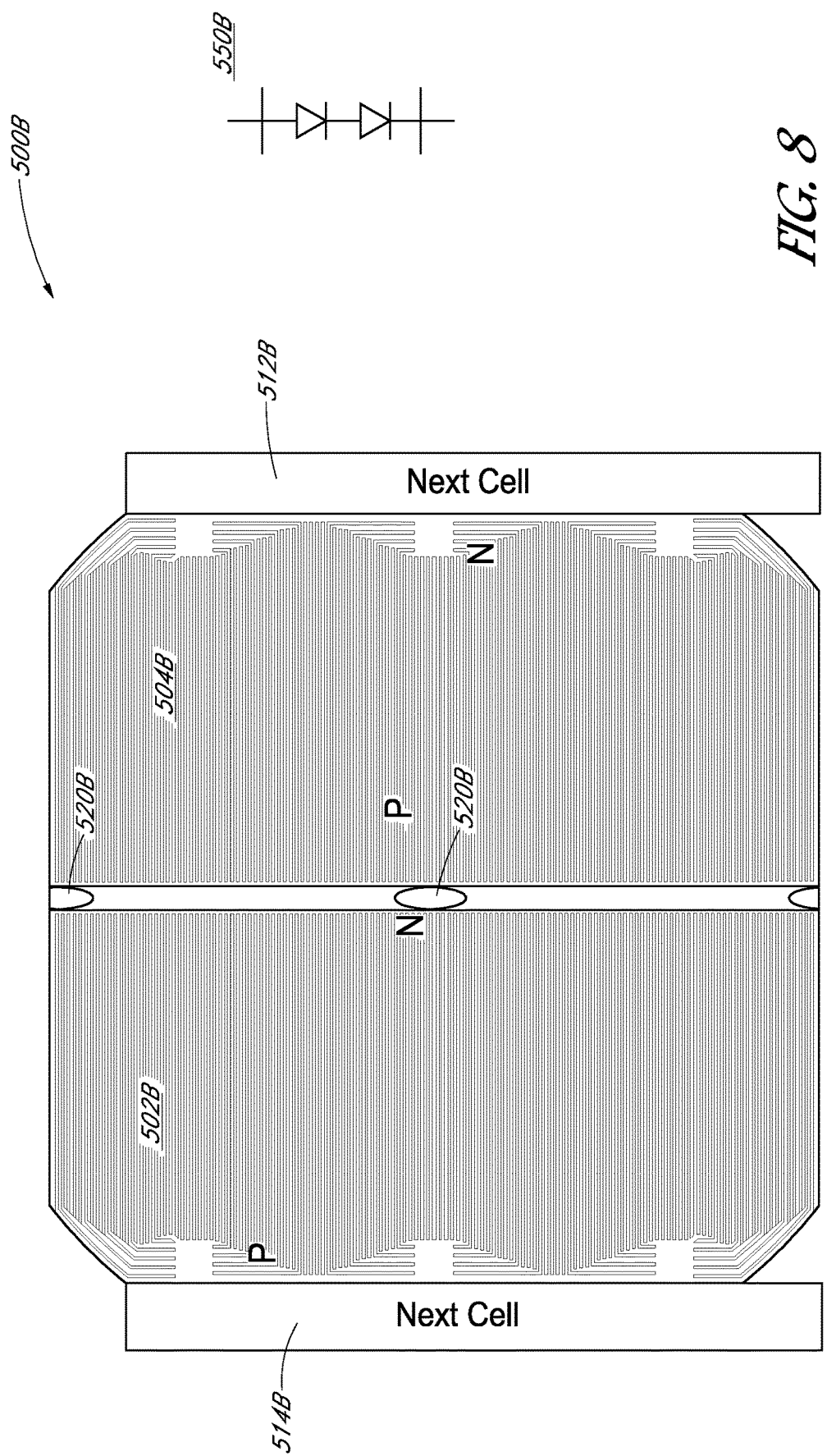

In a fourth example, FIG. 8 illustrates a plan view from the metallization side of an solar cell 500B that has been diced into two sub-cells in a series arrangement, in accordance with an embodiment of the present disclosure. Referring to FIG. 8, the solar cell 500B is singulated to provide two sub-cells 502B and 504B. A metallization line 510B is used to hold the dual-cell design together where each of the sub-cells meet. In one embodiment, stress-relief features 520B are included in the metallization line 510B, as depicted in FIG. 8. Additionally, metallization coupling to a first next cell location 512B and a second next cell location 514B is depicted.

Referring again to FIG. 8, a diode schematic 550B illustrates the electrical configuration of the in series dual-cell design. In an embodiment, the sub-cells are ½ current, same voltage of a single diode full cell, with the combined full cell being ½ the current, but twice voltage of a single diode cell of the same size. The scribe cut can be performed along the emitter junction. The metal line length is ½ standard cell to provide a single metal joint holding two half cells together.

Referring to FIG. 9, another example is shown. As illustrated, FIG. 9 shows a full-size cell made with 10 sub-diodes arranged in a series connection. The voltage of this combined cell is 10× a single diode-cell of the same size. As one example, that voltage would be 6.3 Vmp. The current in the combined cell would be $\frac{1}{10}^{th}$ the current of the original cell (e.g., about 0.5 A). This type of high voltage cell can be used in a module, e.g., a 96 cell module, which would produce a module voltage of ~600V. The 10× reduction in current for this type of cell design can improve reliability and safety through reduction in peak temperatures caused by resistive heating.

As described herein, using such a high voltage cell and high voltage module in an AC power application using an inverter or in an application using a DC power optimizer, scaling the voltage to match the inverter or power optimizer output can result in savings on component costs (e.g., in reducing or eliminating the need for step-up power electronics to go from a standard panel voltage (e.g., ~30-65V) to a typical residential or commercial power need (e.g., ~240 Vrms AC).

Figure 10:
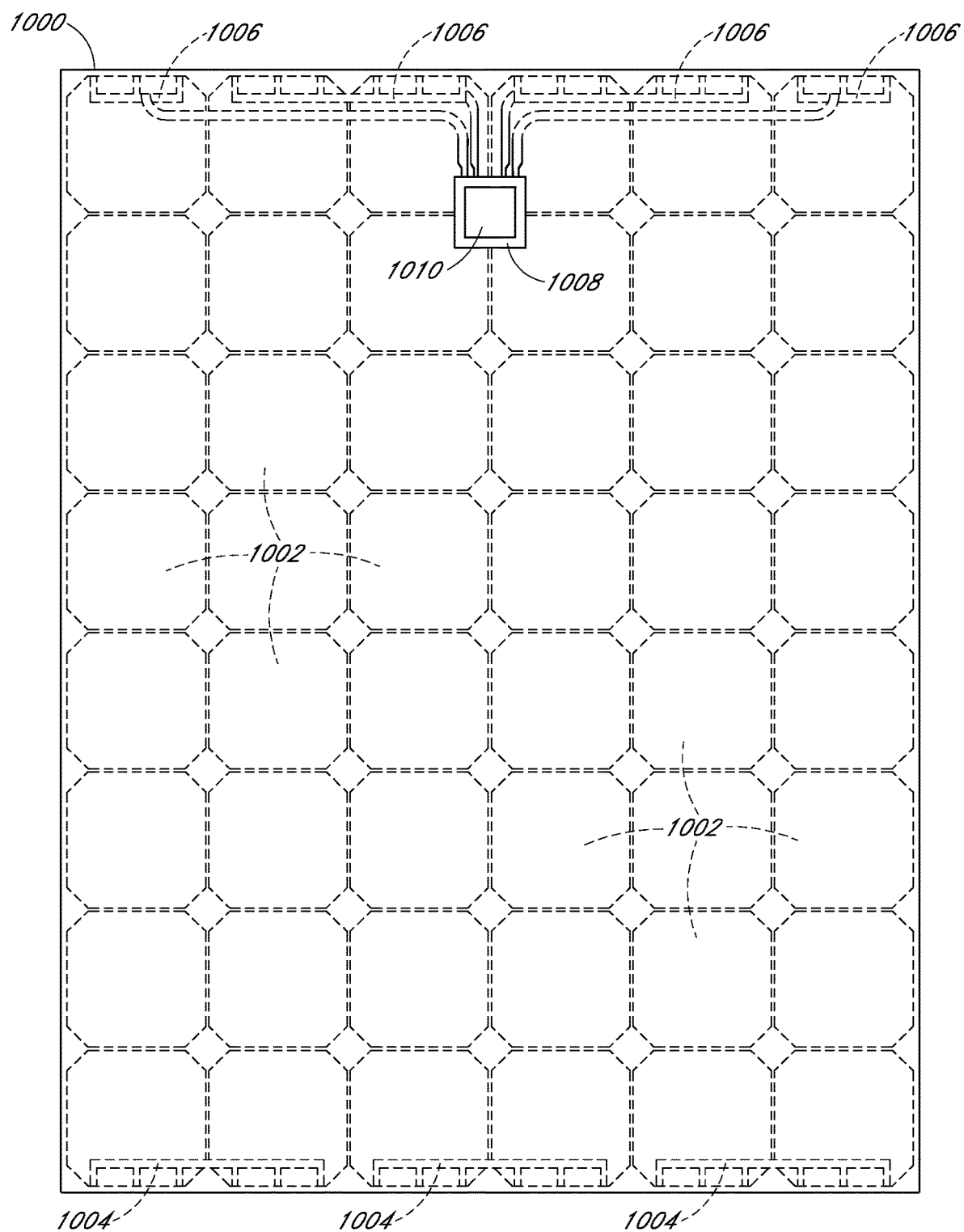
FIG. 10 illustrates an example high voltage PV module, according to some embodiments.

Turning now to FIG. 10, an example high voltage module is illustrated. The PV module has a front side that faces the sun during normal operation and a back side opposite the front side. The PV module can include a frame and a laminate that includes a plurality of PV cells. The laminate can include one or more encapsulant layers that surround and enclose the PV cells. A cover (e.g., glass or some other transparent or substantially transparent material) can be laminated to the encapsulant layers. The layers can have a backsheet that is the backmost layer of the laminate and provides a weatherproof and electrically insulating layer that protects the rest of the laminate. The backsheet can be a polymer backsheet, and can be laminated to the encapsulant layer(s) of the laminate, or it can be integral with one of the encapsulant layers.

FIG. 10 illustrates the backside of PV module 1000. Note that certain components, such as the PV cells, busbars, and connectors are illustrated as dashed lines in FIG. 10 to represent that those components would be at least partially covered by the backsheet and therefore not visible as shown when viewed from the backside. Such a depiction of FIG. 10 is provided for ease of understanding of the various components of PV module 1000.

As shown, high voltage module 1000 can include a plurality of high voltage PV cells. Although PV module 1000 illustrates an array of 48 PV cells 1002, other PV modules can include other numbers of PV cells, such as 60 cells, 96 cells 128 cells, etc. Moreover, not shown in great detail, the six columns are interconnected such that adjacent PV cells 1002 in a given column are connected serially to one or more other adjacent PV cells 1002 in the column. As shown, groups of two columns of PV cells 1002 are connected serially by cell connection pieces 1004.

As described herein, the high voltage solar cells can include sub-diodes, connected in series and/or parallel, for example, according to the disclosed monolithic metallization/singulation techniques or according to conventional techniques. For example, in one embodiment, high voltage module 1000 can be a 96 cell module with the cells having the sub-cell arrangement described in FIG. 9, resulting in a module with Vmp of ~600V. In various embodiments, regardless of how the sub-cells are interconnected (e.g., series, parallel, or some combination thereof), the cells that include those interconnected sub-cells can be connected in series.

At one end of each column/string of cells, busbars 1006 couple the string of cells electrically to junction box 1008. Junction box 1008 is, in turn, mechanically coupled to the backsheet (or frame) of PV module 1000. In such an embodiment, busbars 1006 penetrate the backsheet such that busbars 1006 can be accessed and coupled to junction box 1008. Junction box 1008 can also be coupled (e.g., via a cable) to power conversion device 1010, such as an inverter (e.g., a microinverter) of DC power optimizer. As shown power conversion device 1010 is housed inside/within the housing of junction box 1008 but in other embodiments, power conversion device 1010 can be located outside of junction box 1008. As described herein, use of a high voltage module can minimize the need for power electronics in a power conversion device thereby reducing the amount of space required for the power conversion device. Specifically, in one embodiment, the power conversion device can be a boost-less voltage conversion device. As a result, in one embodiment, the electronics of the power conversion device can be small enough such that the power conversion device can fit within junction box 1008.

Figure 11:
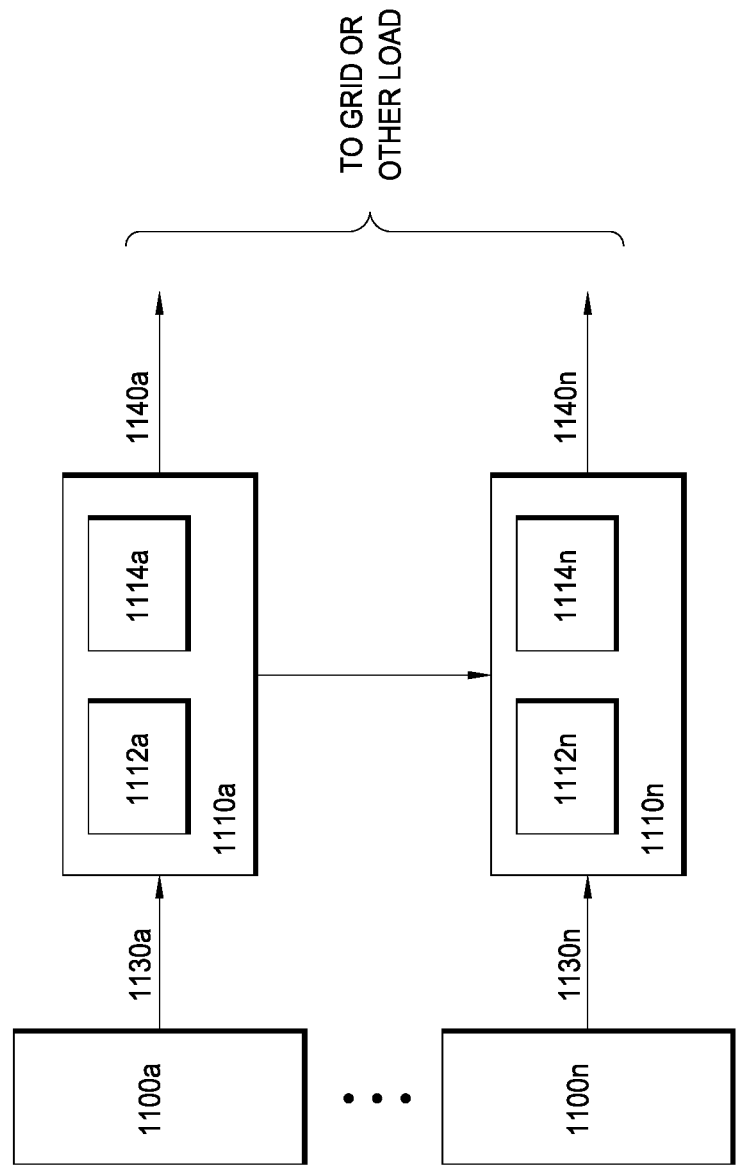
FIG. 11 illustrates a block diagram of a system that includes a high voltage module and boost-less voltage conversion device, according to some embodiments.

Turning now to FIG. 11, a block diagram of a system 1100 that includes high voltage modules 1100a-1100n and boost-less voltage conversion devices 1110a-1100n is illustrated. As shown, high voltage module 1100a provides, as output, high voltage 1130a (e.g., 300V DC, 600V DC, etc.) to boost-less voltage conversion device 1110a. Because the voltage is already high voltage, boost-less conversion device 1110a does not include a boost stage, or a buck-boost stage and metal film storage.

In various embodiments, boost-less conversion device 1110a is configured to convert a first voltage (e.g., high voltage DC) to a second voltage. In some embodiments, boost-less conversion device 1110a can further convert the second voltage to a third voltage. For example, in one embodiment, the first voltage can be high voltage DC (e.g., ~600V) from a high voltage module, the second voltage can be a half-wave rectified intermediate voltage, and the third voltage can be a grid-ready AC voltage (e.g., 120/240V AC). In such an example, the second voltage is an intermediate voltage. In some embodiments, for example, in a DC power optimizer application, both first and second voltages are DC voltages and there may not be an intermediate voltage between the input and output to the boost-less conversion device. In various embodiments, the boost-less voltage conversion device has Vmp>1.43 Vgrid.

As illustrated, boost-less conversion device 1110a includes high frequency isolation transformer 1112a and AC unfolding stage 1114a. Note that in some embodiments, for example, in embodiments in which boost-less conversion device 1110a is a DC power optimizer (e.g., with isolation), AC unfolding stage 1114a may not be present.

In one embodiment, high frequency isolation transformer 1112a is configured to transfer high voltage 1130a while isolating high voltage module 1100a from downstream components. High frequency isolation transformer 1112a is referred to as high frequency because it has a switching frequency greater than approximately 100 KHz and is therefore configured to switch at a frequency greater than 100 KHz. A high frequency isolation transformer can be used because the switching is done at a high voltage. Moreover, by using high frequency switching, smaller magnetics can be used, thereby allowing for a smaller isolation transformer with less heat dissipation. Accordingly, a smaller voltage conversion device can be used, which can allow for incorporation into the junction box.

In an embodiment in which boost-less conversion device 1110a is a microinverter, high frequency isolation transformer 1112a can provide the transferred high voltage to AC unfolding stage 1114a. As was the case with the isolation transformer, AC unfolding stage 1114a can be designed with high frequency (e.g., >100 KHz) switching devices. In one embodiment, AC unfolding stage 1114a can be a cycloconverter-based AC unfolding stage. AC unfolding stage 1114a can be configured to convert the voltage into a grid-ready AC voltage, as described herein.

In various embodiments, several high voltage panels and corresponding boost-less conversion devices can be part of a system. For example, in one embodiment, a first high voltage PV module is coupled to a first boost-less microinverter, a second high voltage PV module is coupled to a second boost-less microinverter, and so on. The outputs from the second boost-less microinverter can be combined together in series or parallel and then tied to the grid. Therefore, the system can include a number of high voltage panels and boost-less conversion devices in a string.

In another embodiment, each high voltage panel and boost-less conversion device is coupled directly to the grid. In other embodiments, the disclosed system can be implemented in a grid-less application.

Although FIG. 11 illustrates a one-to-one correspondence of high voltage modules to boost-less conversion devices, in other embodiments, multiple high voltage modules can be coupled to a particular boost-less conversion device (e.g., 2 high voltage module per microinverter) or multiple boost-less-conversion devices can be coupled to a particular high voltage module (e.g., 2 microinverters per high voltage module). In one embodiment, a configuration of high voltage modules per microinverters can be determined to meet $V_{IN}<1$ kV. For example, if the high voltage module has a Vmp of 1 kV DC, then only one high voltage module may output to a particular microinverter, whereas if each high voltage module has a Vmp of 300V, then 1, 2, or 3 high voltage modules can output to a single shared microinverter. Other examples also exist.

Figure 12A:
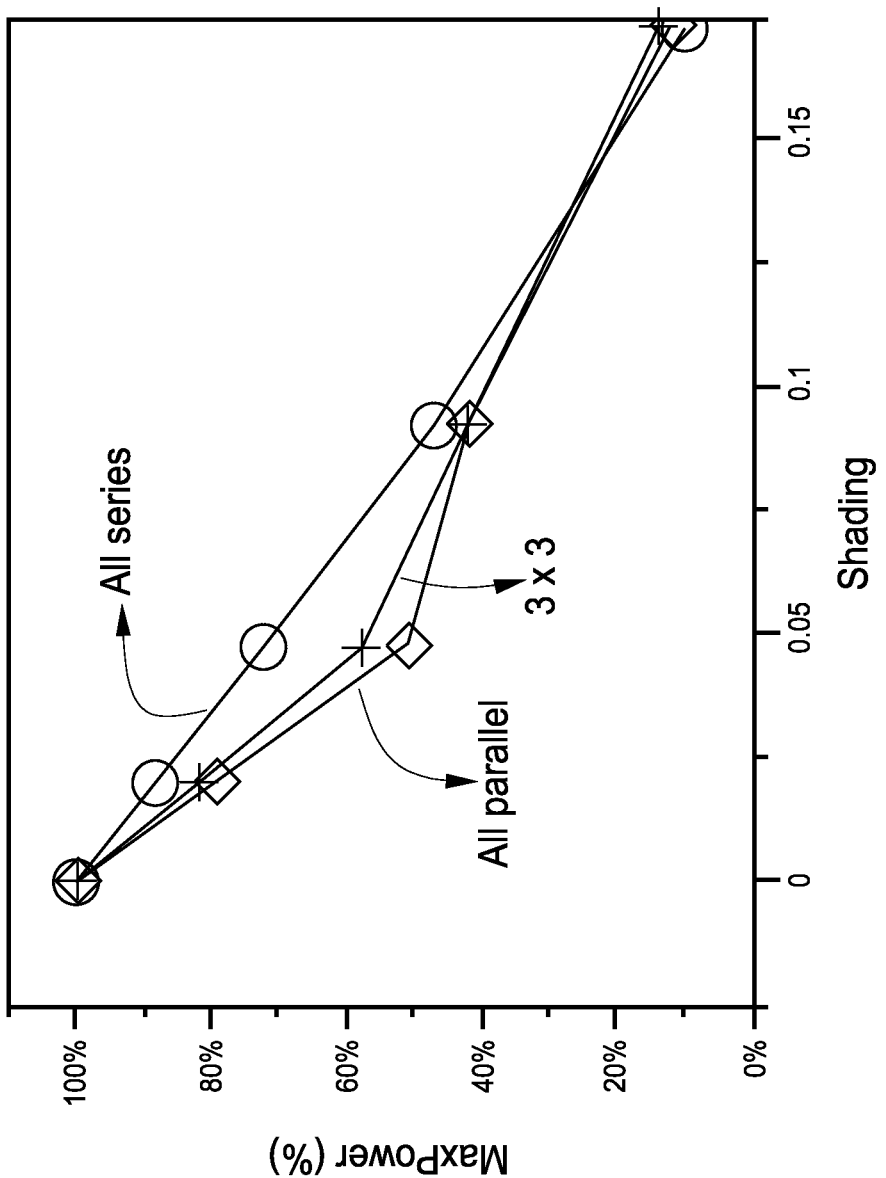
FIGS. 12a-12c illustrate example performance for example 96-cell high voltage modules, according to some embodiments.
Figure 12B:
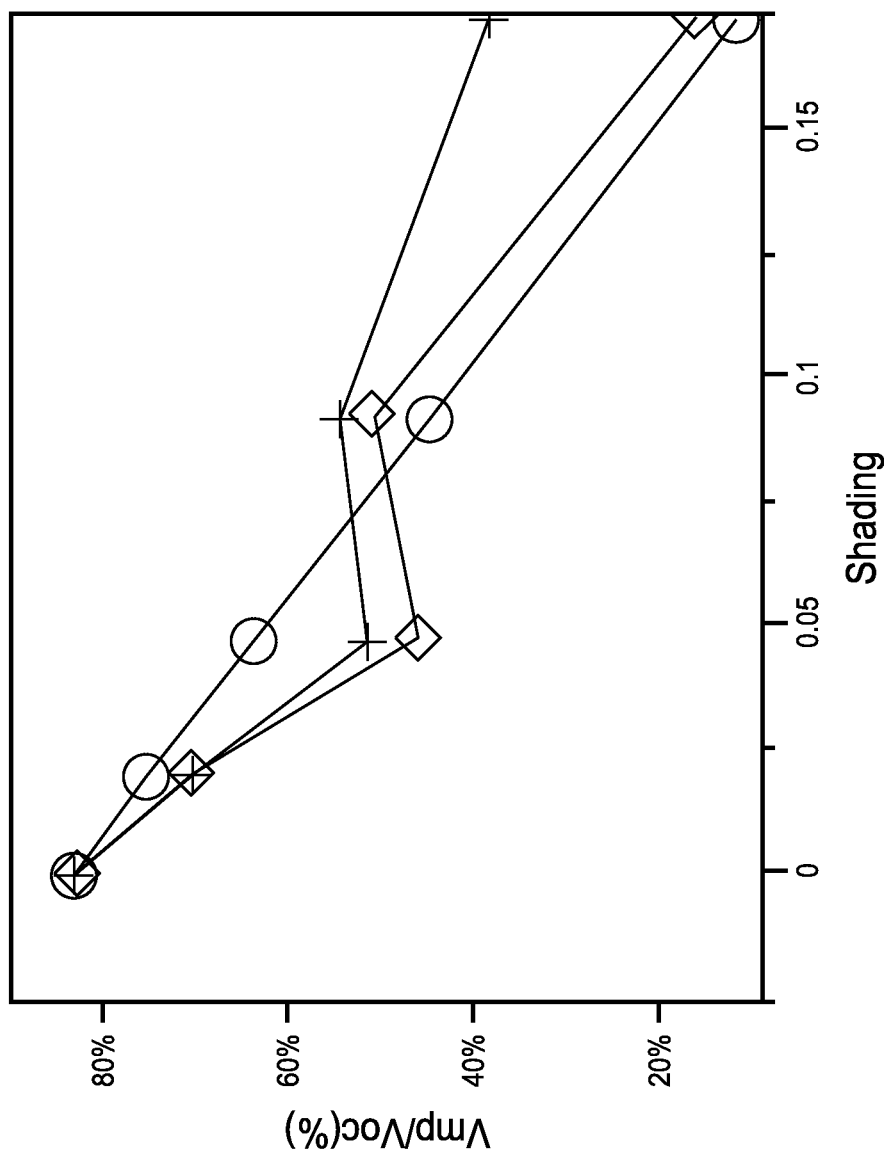
Figure 12C:
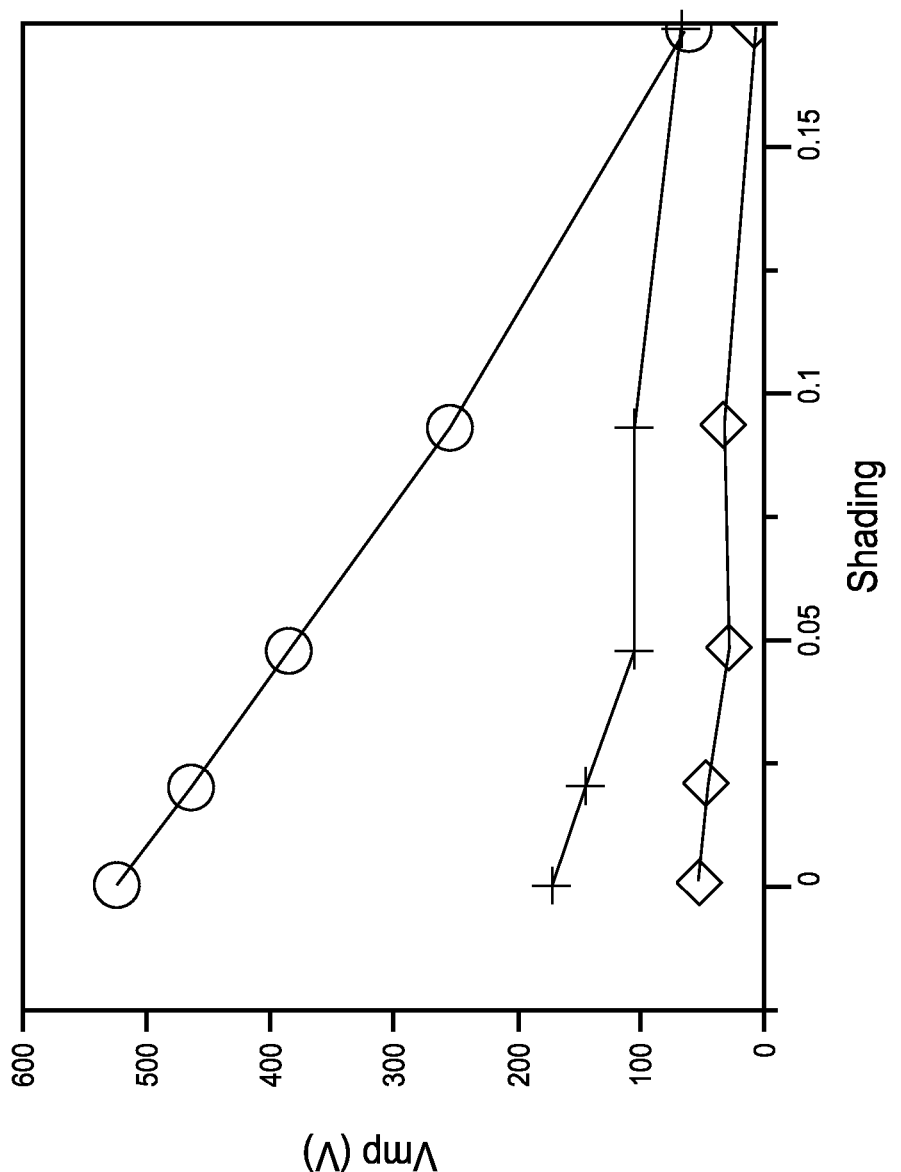
Figure 13A:
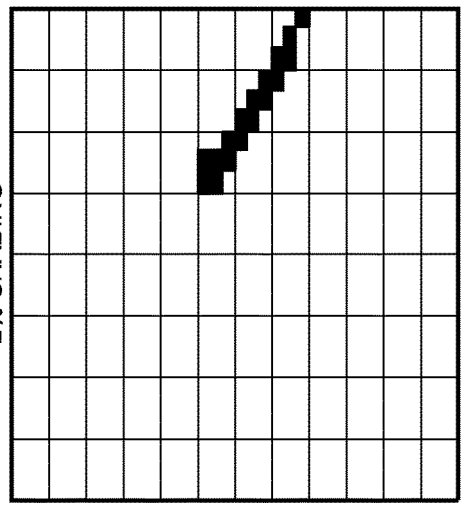
FIGS. 13a-13d illustrate example shading scenarios for example 96-cell high voltage modules.
Figure 13B:
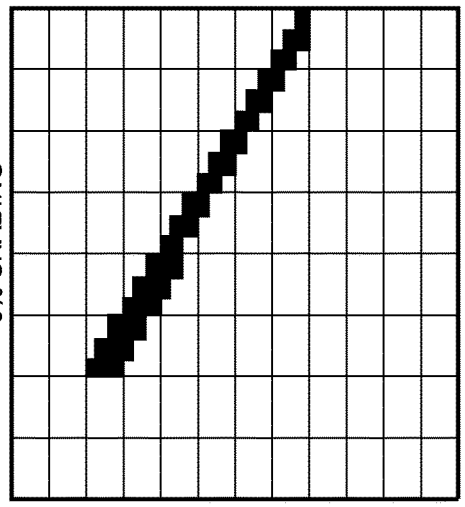
Figure 13C:
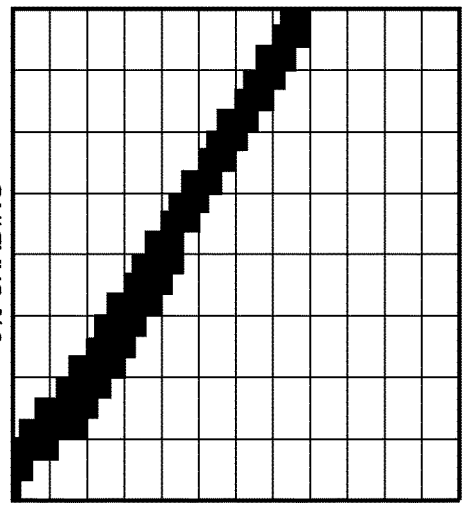
Figure 13D:
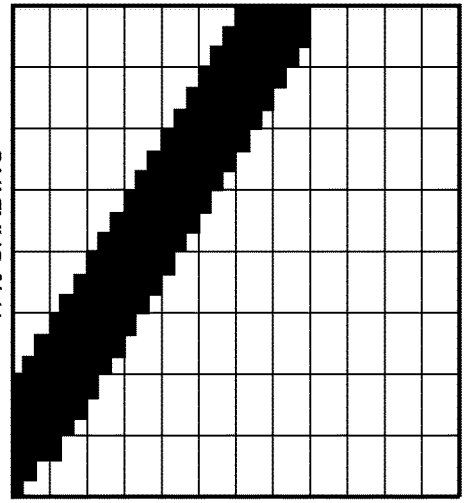
Figure 14A:
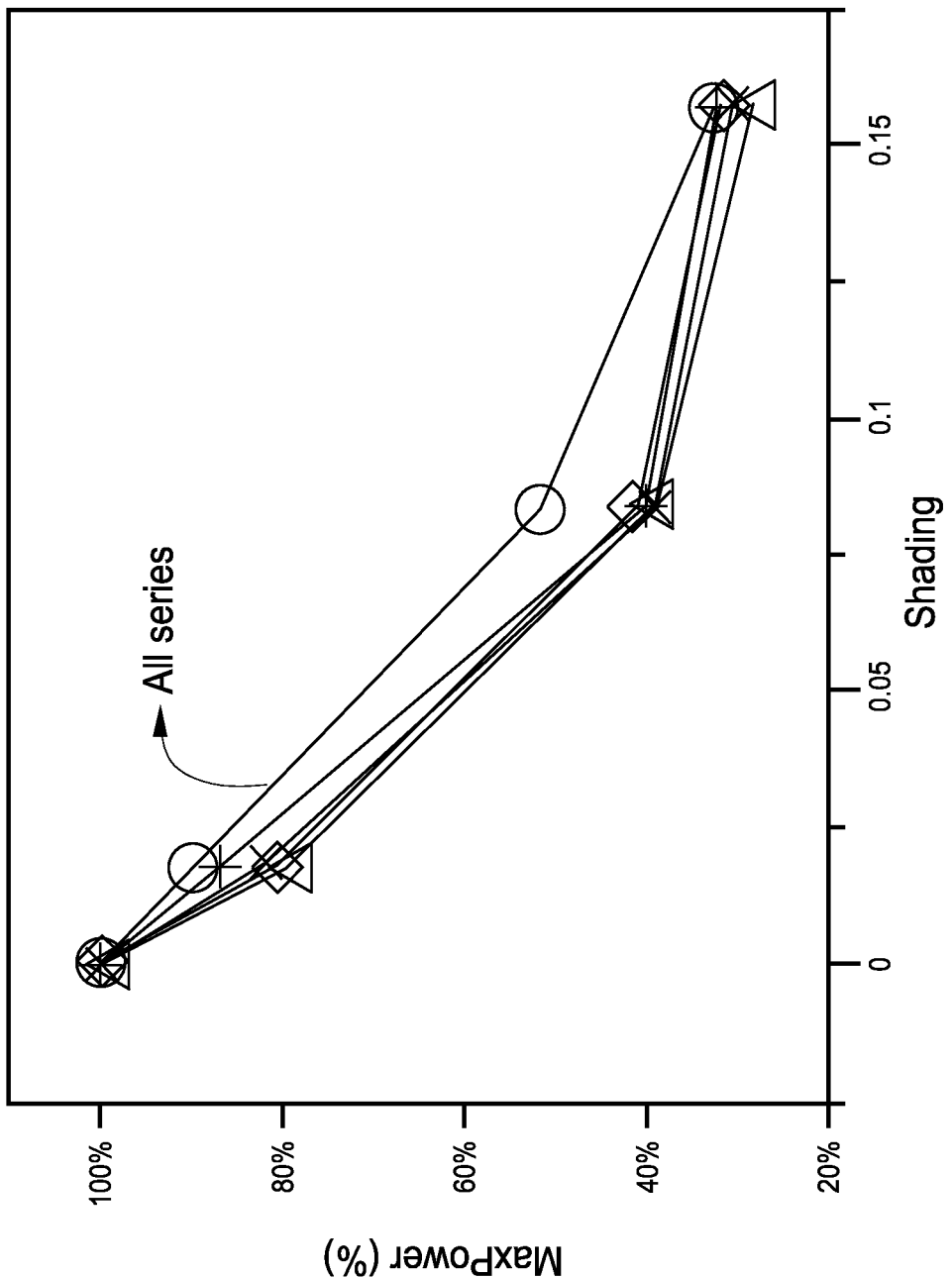
FIGS. 14a-14c illustrate example performance for example 60-cell high voltage modules, according to some embodiments
Figure 14B:
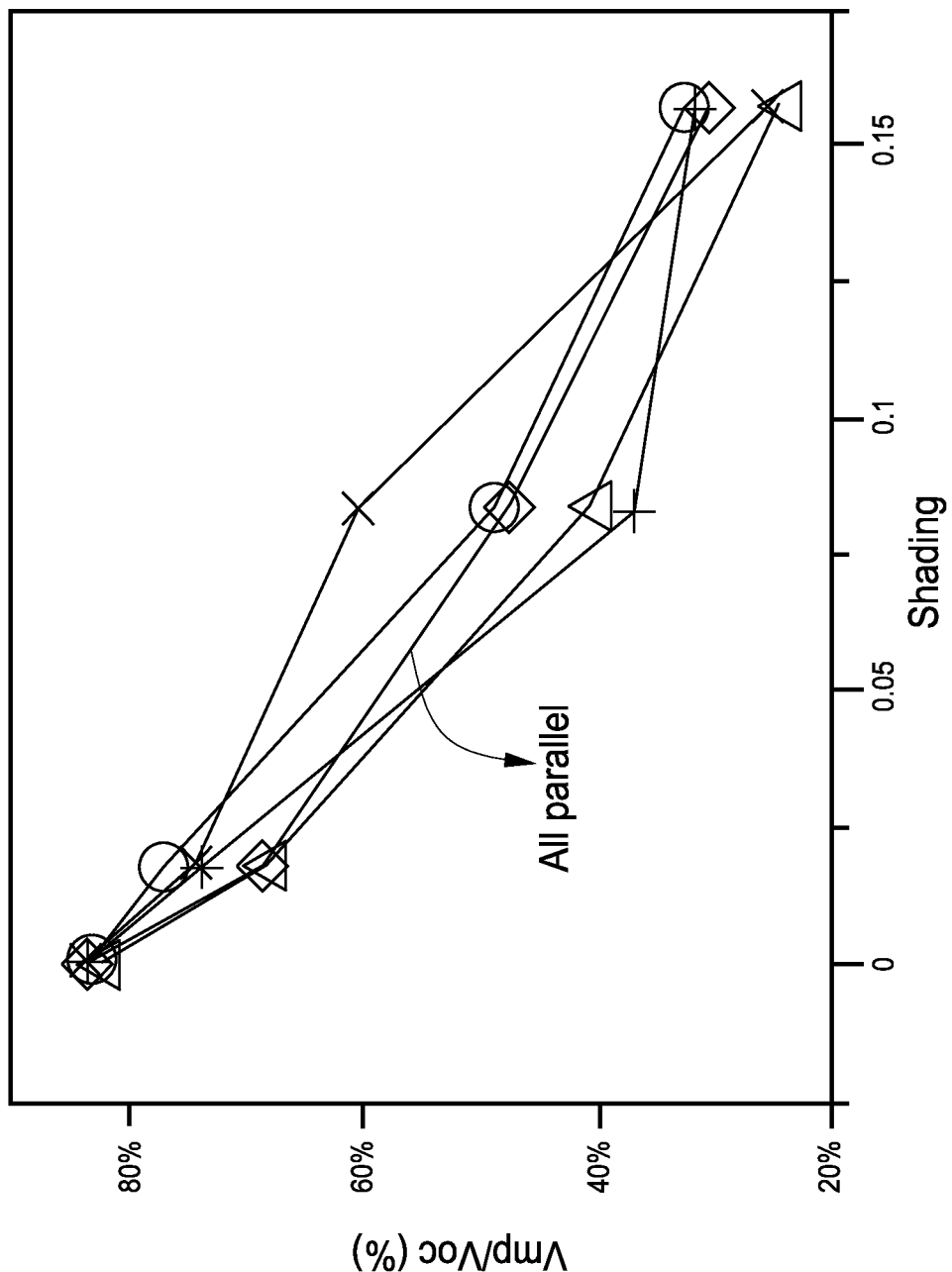
Figure 14C:
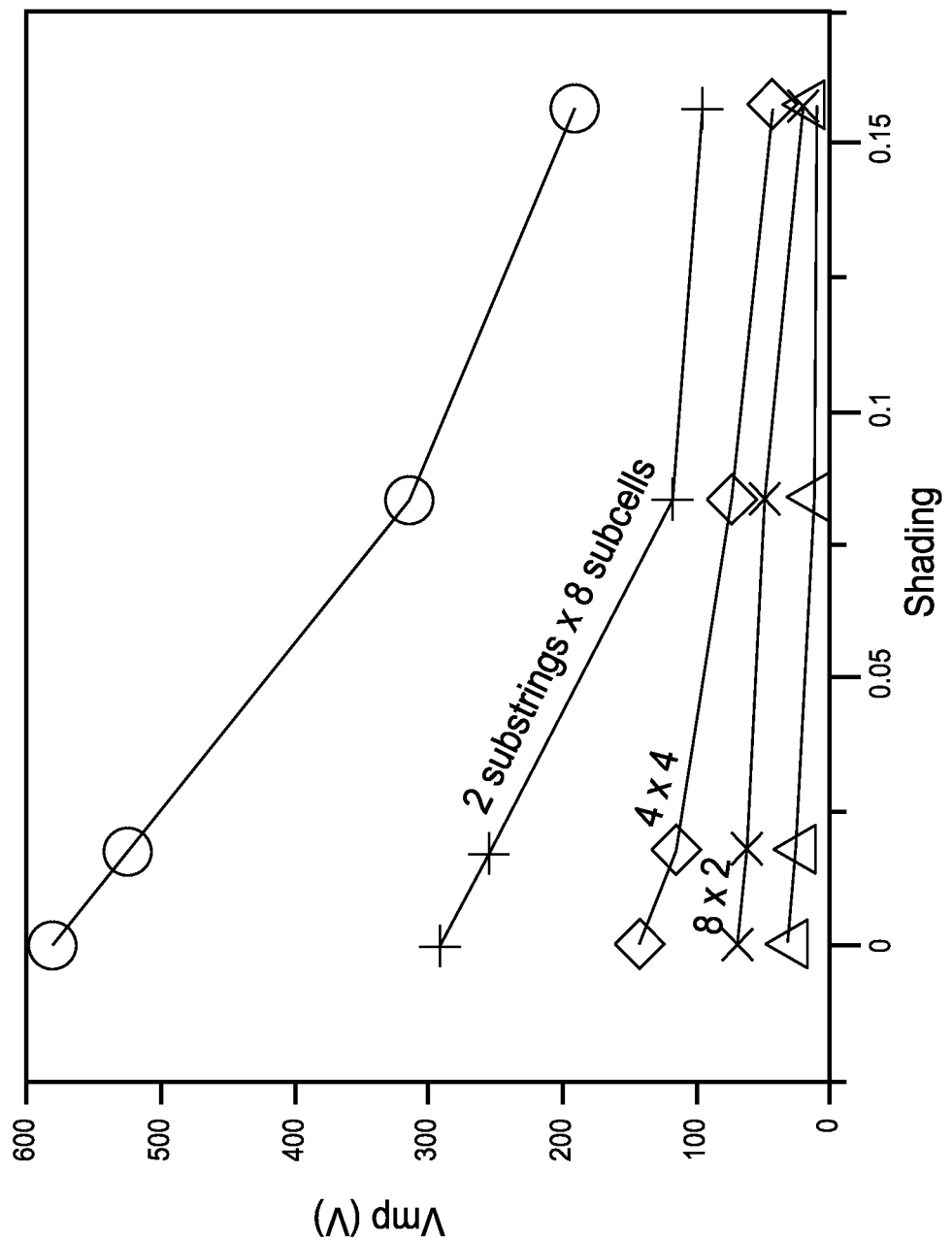

FIG. 12a-12c illustrate example performance for example 96-cell high voltage modules under the shading scenarios of FIGS. 13a-13d. As shown, FIGS. 13a-13d illustrate shading on a 96-cell module having 8 columns of 12 cells with each cell being diced into 9 subcells. FIGS. 13a, 13b, 13c, and 13d illustrate 2%, 5%, 9%, and 17% shading respectively. Such shading could be from trees, building structures (e.g., chimneys, satellite dish, etc.) and can vary in size and pattern over the course of the day. As such, the shading patterns are simple examples to illustrate performance of particular high voltage modules. The all series line in FIGS. 12a-12c means that each cell has all of its sub-cells in series, the all parallel line means that each cell has all of its sub-cells in parallel, and 3×3 means that each sub-cell has 3 series strings of 3 sub-cells in parallel. Note that other examples may also exist, other than the aforementioned all series, all parallel, and 3×3.

FIG. 12a illustrates that the max power percentage is generally larger for the all series configuration especially at lower levels of shading for these particular shading patterns. FIG. 12b illustrates that Vmp/Voc as a percentage is higher than the other configurations for the all series configuration at lower shading levels but lower at higher shading levels. FIG. 12c illustrates that Vmp is generally higher for the all series configuration than the other configurations at most of the example shading levels.

Similar to FIGS. 12a-12c, FIGS. 14a-14c illustrate example performance for example 60-cell high voltage modules, with each cell diced into 16 subcells, under shading scenarios similar to those of FIGS. 13a-13d.

As was the case with FIGS. 12a-12c, FIGS. 14a-14c generally illustrate that the series configuration has better performance especially at lower levels of shading for these particular shading patterns. Moreover, both the 96-cell and 60-cell modules generally illustrate that a module with high voltage cells can provide Vmp higher than a conventional module under no shading or partial shading, that an all series connection of sub-cells can provide relatively good tolerance to partial shading in terms of power and Vmp loss (with the loss being dependent on the shading conditions, such as shapes or intensity).

Note that in either example configuration, Vmp is still about ~300V at approximately 10% shading, such that it can still operate as a high voltage module that can be used with a boost-less voltage conversion device. In one embodiment, a voltage conversion device can be configured to operate in a boost-less mode, but can also be configured to switch to and operate in a boost mode, for example, if shading drops Vmp below a certain value (e.g., 300V, 260V, etc.) such that the output of the module can still be high voltage. In one embodiment, instead of switching to and operating in a boost mode, the boost-less voltage conversion device can be configured to operate in a bypass mode to bypass the module.

The disclosed high voltage solar cells, modules, can reduce the cost, volume, and weight and increase the efficiency of boost-less voltage conversion devices.

Although specific embodiments have been described above, these embodiments are not intended to limit the scope of the present disclosure, even where only a single embodiment is described with respect to a particular feature. Examples of features provided in the disclosure are intended to be illustrative rather than restrictive unless stated otherwise. The above description is intended to cover such alternatives, modifications, and equivalents as would be apparent to a person skilled in the art having the benefit of this disclosure.

The scope of the present disclosure includes any feature or combination of features disclosed herein (either explicitly or implicitly), or any generalization thereof, whether or not it mitigates any or all of the problems addressed herein. Accordingly, new claims may be formulated during prosecution of this application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

What is claimed is:

1. A photovoltaic module, comprising:
a photovoltaic laminate that includes a plurality of physically separated sub-cells formed upon singulation of a photovoltaic cell, each of the plurality of sub-cells comprising a N-type semiconductor region and a P-type semiconductor region on a back surface, opposite a light-receiving surface, of each of the singulated and physically separated sub-cells, a metallization structure comprising a metal portion which electrically bridges but does not entirely overlap the- N-type semiconductor region of a first sub-cell to the P-type semiconductor region of a second sub-cell of the plurality of sub-cells, wherein the N-type semiconductor region of the first sub-cell and the P-type semiconductor region of the second sub-cell of the plurality of sub-cells extend along edges of respective sub-cells along a length of a groove that separates the N-type semiconductor region of the first sub-cell from the P-type semiconductor region of the second sub-cell of the plurality of sub-cells, the length of the groove being parallel along a same direction as an edge of the first sub-cell and an edge of the second sub-cell defining the groove, and the length of the groove orthogonal to a width of the groove, the width extending from the edge of the first sub-cell to the edge of the second sub-cell defining the groove, wherein the metal portion is directly on the N-type semiconductor region of the first sub-cell and directly on the P-type semiconductor region of the second sub-cell of the plurality of sub-cells, and the metal portion is a continuous structure that extends over the groove for substantially all of an entirety of the length of the groove.

2. The photovoltaic module of claim 1, wherein the metal portion of the metallization structure connects the sub-cells in-parallel, in-series, or a combination thereof.

3. The photovoltaic module of claim 1, further comprising a boost-less voltage conversion device configured to convert a first voltage from the photovoltaic laminate to a second voltage.

4. The photovoltaic module of claim 1, wherein the metallization structure comprises a plated metal or a metal foil.

5. The photovoltaic module of claim 3, further comprising a junction box, wherein the boost-less voltage conversion device is located inside a housing of the junction box.

6. The photovoltaic module of claim 3, wherein the boost-less voltage conversion device includes a high frequency isolation transformer with a switching frequency greater than 100 KHz.

7. The photovoltaic module of claim 3, wherein the boost-less voltage conversion device is further configured to convert the second voltage to a third voltage.

8. The photovoltaic module of claim 3, wherein the boost-less voltage conversion device has Vmp>1.43 Vgrid.

9. The photovoltaic module of claim 3, wherein the boost-less voltage conversion device is a boost-less direct current (DC) power optimizer with isolation, wherein both the first and second voltages are DC voltages.

10. The photovoltaic module of claim 3, wherein the boost-less voltage conversion device is configured to provide the second voltage to a power grid.

11. The photovoltaic module of claim 3, wherein the boost-less voltage conversion device is further configured to operate in a bypass mode dependent on a Vmp of the photovoltaic module falling below a threshold value.

12. A photovoltaic module, comprising:
a photovoltaic laminate that includes a plurality of photovoltaic cells, wherein each of the plurality of the photovoltaic cells comprises a plurality of physically separated sub-cells formed upon singulation of the photovoltaic cells, each of the plurality of sub-cells comprising a N-type semiconductor region and a P-type semiconductor region on a back surface, opposite a light-receiving surface, of each of the singulated and physically separated sub-cells, a metallization structure comprising a metal portion which electrically bridges but does not entirely overlap the N-type semiconductor region of a first sub-cell to the P-type semiconductor region of a second sub-cell of the plurality of sub-cells, wherein the N-type semiconductor region of the first sub-cell and the P-type semiconductor region of the second sub-cell of the plurality of sub-cells extend along edges of respective sub-cells along a length of a groove that separates the N-type semiconductor region of the first sub-cell from the P-type semiconductor region of the second sub-cell of the plurality of sub-cells, the length of the groove being parallel along a same direction as an edge of the first sub-cell and an edge of the second sub-cell defining the groove, and the length of the groove orthogonal to a width of the groove, the width extending from the edge of the first sub-cell to the edge of the second sub-cell defining the groove, wherein the metal portion is directly on the N-type semiconductor region of the first sub-cell and directly on the P-type semiconductor region of the second sub-cell of the plurality of sub-cells, and the metal portion is a continuous structure that extends over the groove for substantially all of an entirety of the length of the groove.

13. The photovoltaic module of claim 12, wherein the metal portion of the metallization structure connects the sub-cells in-parallel, in-series, or a combination thereof.

14. The photovoltaic module of claim 12, wherein the metallization structure comprises a plated metal or a metal foil.

15. The photovoltaic module of claim 12, further comprising a junction box, wherein a boost-less voltage conversion device is located inside a housing of the junction box.

16. A photovoltaic laminate, the photovoltaic laminate comprising:
a plurality of physically separated sub-cells formed upon singulation of a photovoltaic cell, each of the plurality of sub-cells comprising a N-type semiconductor region and a P-type semiconductor region on a back surface, opposite a light-receiving surface, of each of the singulated and physically separated sub-cells, a metallization structure comprising a metal portion which electrically bridges but does not entirely overlap the N-type semiconductor region of a first sub-cell to the P-type semiconductor region of a second sub-cell of the plurality of sub-cells, wherein the N-type semiconductor region of the first sub-cell and the P-type semiconductor region of the second sub-cell of the plurality of sub-cells extend along edges of respective sub-cells along a length of a groove that separates the N-type semiconductor region of the first sub-cell from the P-type semiconductor region of the second sub-cell of the plurality of sub-cells, the length of the groove being parallel along a same direction as an edge of the first sub-cell and an edge of the second sub-cell defining the groove, and the length of the groove orthogonal to a width of the groove, the width extending from the edge of the first sub-cell to the edge of the second sub-cell defining the groove, wherein the metal portion is directly on the N-type semiconductor region of the first sub-cell and directly on the P-type semiconductor region of the second sub-cell of the plurality of sub-cells, and the metal portion is a continuous structure that extends over the groove for substantially all of an entirety of the length of the groove.

17. The photovoltaic module of claim 16, wherein the metal portion of the metallization structure connects the sub-cells in-parallel, in-series, or a combination thereof.

18. The photovoltaic module of claim 16, wherein the metallization structure comprises a plated metal or a metal foil.

19. The photovoltaic module of claim 16, further comprising a junction box, wherein a boost-less voltage conversion device is located inside a housing of the junction box.

20. The photovoltaic module of claim 3, wherein the boost-less voltage conversion device is a boost-less microinverter, wherein the first voltage is a direct current (DC) voltage and the second voltage is an alternating current (AC) voltage.

21. The photovoltaic module of claim 1, wherein the groove is a thin laser groove.

* * * * *